(12) United States Patent
Chen

(10) Patent No.: US 7,545,641 B2
(45) Date of Patent: Jun. 9, 2009

(54) COMPUTER HOUSING SHOCK ABSORBER DEVICE FOR A VIBRATION SOURCE FRAME

(75) Inventor: Richard Chen, San Jose, CA (US)

(73) Assignee: Super Micro Computer Inc., San Jose, CA (US)

( * ) Notice: Subject to any disclaimer, the term of this patent is extended or adjusted under 35 U.S.C. 154(b) by 225 days.

(21) Appl. No.: 11/790,094

(22) Filed: Apr. 23, 2007

(65) Prior Publication Data
US 2008/0259562 A1    Oct. 23, 2008

(51) Int. Cl.
*H05K 7/20* (2006.01)
*F04D 29/66* (2006.01)

(52) U.S. Cl. .................. 361/695; 361/683; 361/690; 361/679.48; 415/213.1

(58) Field of Classification Search .......... 361/690, 361/683, 695, 679.48; 415/213.1
See application file for complete search history.

(56) References Cited

U.S. PATENT DOCUMENTS

| | | | | |
|---|---|---|---|---|
| 4,568,243 A * | 2/1986 | Schubert et al. | ......... | 415/213.1 |
| 4,807,718 A * | 2/1989 | Lotz | ............ | 181/202 |
| 4,819,503 A * | 4/1989 | Fazi et al. | ........... | 248/632 |
| 5,186,605 A * | 2/1993 | Tracy | ............ | 601/2 |
| 5,208,730 A * | 5/1993 | Tracy | ........... | 361/687 |
| 5,316,423 A * | 5/1994 | Kin | ............ | 411/510 |
| 5,788,566 A * | 8/1998 | McAnally et al. | ........... | 454/184 |
| 5,969,941 A * | 10/1999 | Cho | ............ | 361/687 |
| 6,351,380 B1 * | 2/2002 | Curlee et al. | ........... | 361/695 |
| 6,894,897 B1 * | 5/2005 | Nagurny et al. | ........... | 361/695 |
| 6,912,127 B2 * | 6/2005 | Hutchinson et al. | ........ | 361/695 |
| 6,924,980 B2 * | 8/2005 | Lehman et al. | ........... | 361/695 |
| 7,134,203 B2 * | 11/2006 | Hutchinson et al. | ........ | 29/889.3 |
| 7,255,529 B2 * | 8/2007 | Ku et al. | ........... | 415/119 |
| 7,306,425 B2 * | 12/2007 | Park et al. | ........... | 415/119 |
| 7,312,991 B2 * | 12/2007 | Lee et al. | ........... | 361/695 |
| 7,347,665 B2 * | 3/2008 | Thoma | ........... | 415/213.1 |
| 7,379,300 B1 * | 5/2008 | Chen | ........... | 361/695 |
| 7,384,210 B2 * | 6/2008 | Sura et al. | ........... | 403/168 |
| 7,385,814 B1 * | 6/2008 | Chen | ........... | 361/695 |
| 7,450,379 B2 * | 11/2008 | Chen et al. | ........... | 361/695 |
| 2004/0010351 A1 * | 1/2004 | Mohiuddin et al. | ........ | 700/300 |
| 2007/0154300 A1 * | 7/2007 | Liang | ........... | 415/119 |
| 2007/0237625 A1 * | 10/2007 | Liang | ........... | 415/119 |

FOREIGN PATENT DOCUMENTS

| | | |
|---|---|---|
| DE | 3408139 A1 * | 9/1985 |
| JP | 54109613 A * | 8/1979 |
| JP | 05167280 A * | 7/1993 |
| WO | WO 9304289 A1 * | 3/1993 |

* cited by examiner

*Primary Examiner*—Anatoly Vortman
(74) *Attorney, Agent, or Firm*—Troxell Law Office PLLC

(57) ABSTRACT

A computer housing shock absorber device for a vibration source frame, which includes:
   a computer housing provided with a U-shaped holding space;
   an inner fixing frame fixed within the U-shaped holding space;
   an outer fixing frame;

The shock absorber elements mounted on circumferential edge walls of the connecting holes of the inner fixing frame. Upper and lower portions of each of the recessed circular grooves of the shock absorber elements are respectively provided with a cylindrical body, and one of the cylindrical bodies of each of the shock absorber elements lies between the upper surface of the outer fixing frame and the upper surface of the inner fixing frame. Accordingly, the vibratory moment on the outer fixing frame produced by rotation of the fans is absorbed by the shock absorber elements.

7 Claims, 7 Drawing Sheets

COMPUTER HOUSING SHOCK ABSORBER DEVICE FOR A VIBRATION SOURCE FRAME

BACKGROUND OF THE INVENTION (a) Field of the Invention

The present invention provides a computer housing shock absorber device for a vibration source frame, and more particularly to a device that uses shock absorber elements to respectively absorb the torsional moment and vibratory force imparted on a frame body by fan motors to achieve shock absorption effectiveness of the entire computer housing.

(b) Description of the Prior Art

At least more than one fan is installed within a conventional server or host computer, and a typical structure, such as U.S. patent application Ser. No. 11/320,840, is provided with rubber cushions (30) and cylindrical bodies (40) to serve as connecting elements to achieve shock absorption effectiveness. However, such devices are only applicable for use in small spaces, for example, the interior space of a power supply, whereas a large scale server or host computer housing, wherein the interior space is relatively large, has a great number of heat dissipating fans and a great number of internal frames. However, the rubber shock absorbing cushion material is unable to provide complete shock absorption effectiveness for the entire host computer housing.

Hence, the subject of study of the present invention is to provide a device that is able to achieve maximum shock absorption effectiveness when a plurality of fans are rotating within a computer housing.

SUMMARY OF THE INVENTION

A primary objective of the present invention is to provide a computer housing shock absorber device for a vibration source frame that uses shock absorber elements equally connected to connecting interfaces between an outer fixing frame fixedly disposed with heat dissipating fans and an inner fixing frame and a U-shaped holding space of a computer housing. The vibratory moment produced when the heat dissipating fans are rotating is transmitted outward through the outer fixing frame and absorbed by a plurality of the shock absorber elements, thus, the vibratory force on the entire computer housing is substantially reduced, noise is decreased, moreover, the shock absorber elements effectively prevent the risk of internal components and connecting pieces of the computer housing from coming loose due to vibration.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

Figure 1:
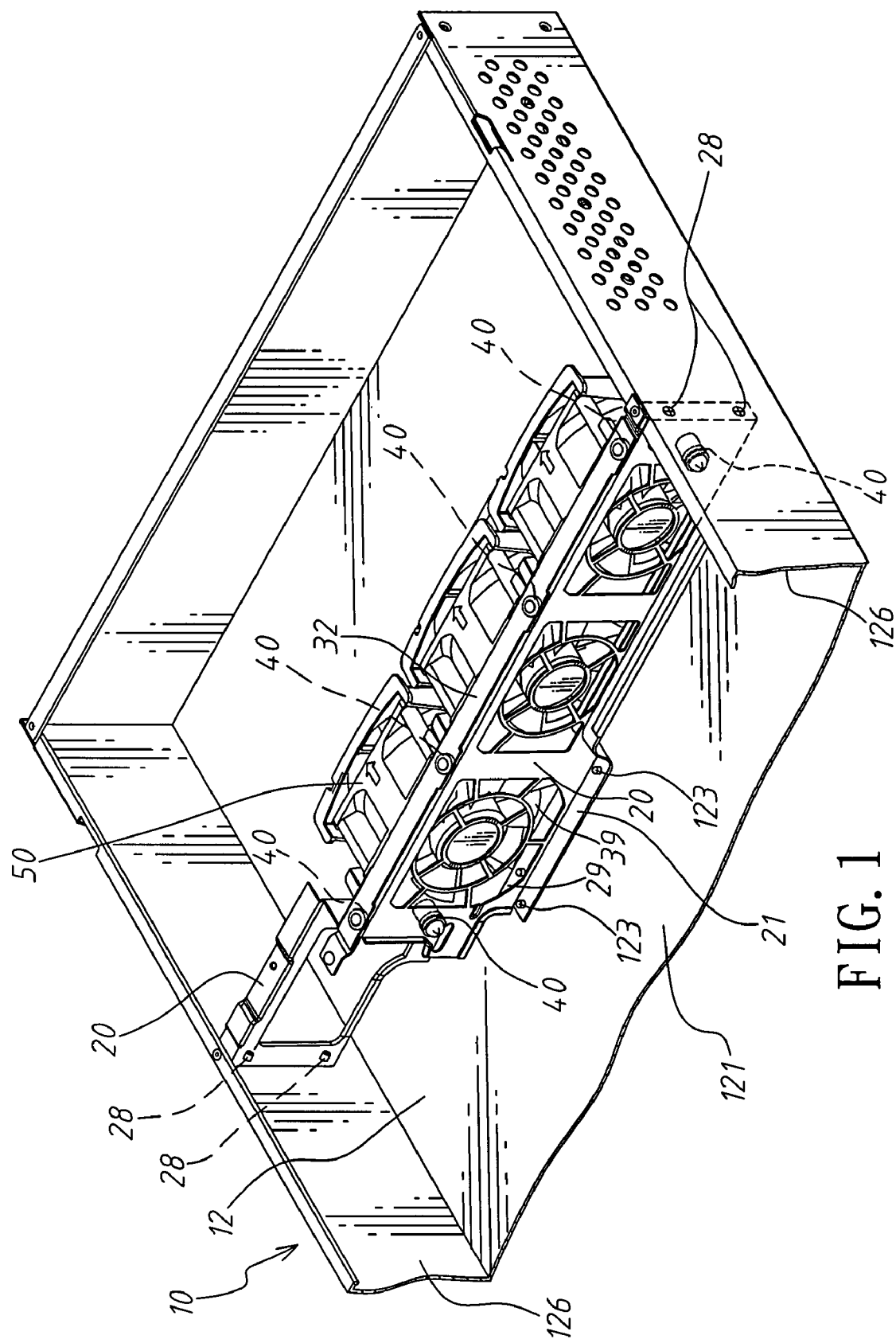
FIG. 1 shows an assembled elevational view of the present invention.

Referring to FIGS. 1, 2, 3, and 4, which show the computer housing shock absorber device for a vibration source frame provided by the present invention, comprising:

A computer housing 10 provided with a U-shaped holding space 12.

An inner fixing frame 20, transversally fixed within the U-shaped holding space 12, at least more than one connecting hole 24 is defined in a horizontal upper surface 22 of the inner fixing frame 20.

An outer fixing frame 30, on outer sides of which are fixedly clamped at least more than one heat dissipating fan 50. A top portion of the outer fixing frame 30 is configured with a horizontal upper surface 32, and connecting posts 321 are evenly disposed on a bottom surface of the horizontal upper surface 32.

Figure 8:
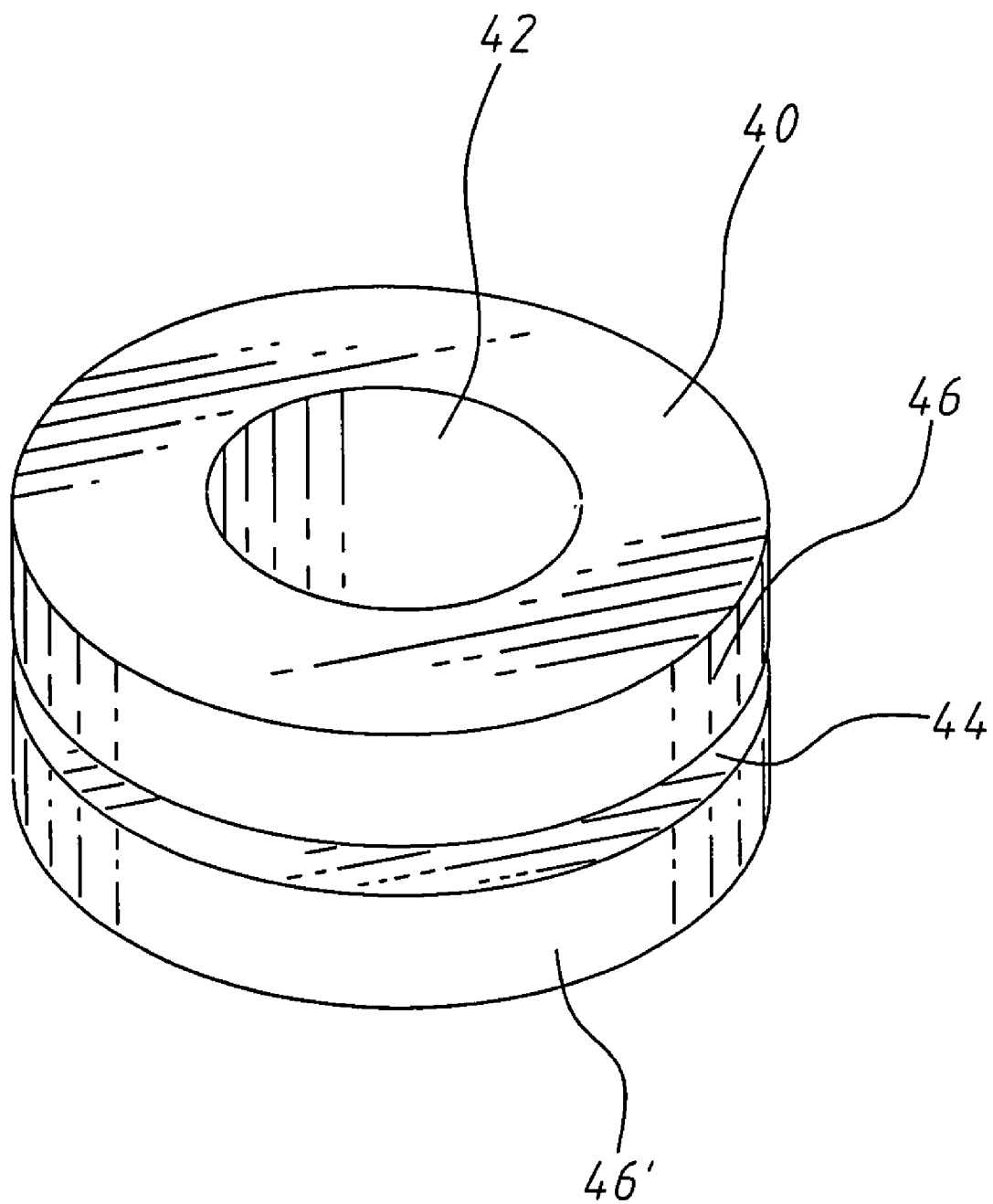
FIG. 8 shows an elevational view of a shock absorber element of the present invention.

At least more than one shock absorber element 40 (as depicted in FIG. 8), formed as cylindrical bodies, in the center of each of which is defined a through hole 42. A recessed circular groove 44 is defined in the circumference of each of the shock absorber elements 40, and the recessed circular grooves 44 are respectively mounted on circumferential edge walls of the connecting holes 24 of the inner fixing frame 20, while the connecting posts 321 respectively penetrate the through holes 42.

Figure 7:
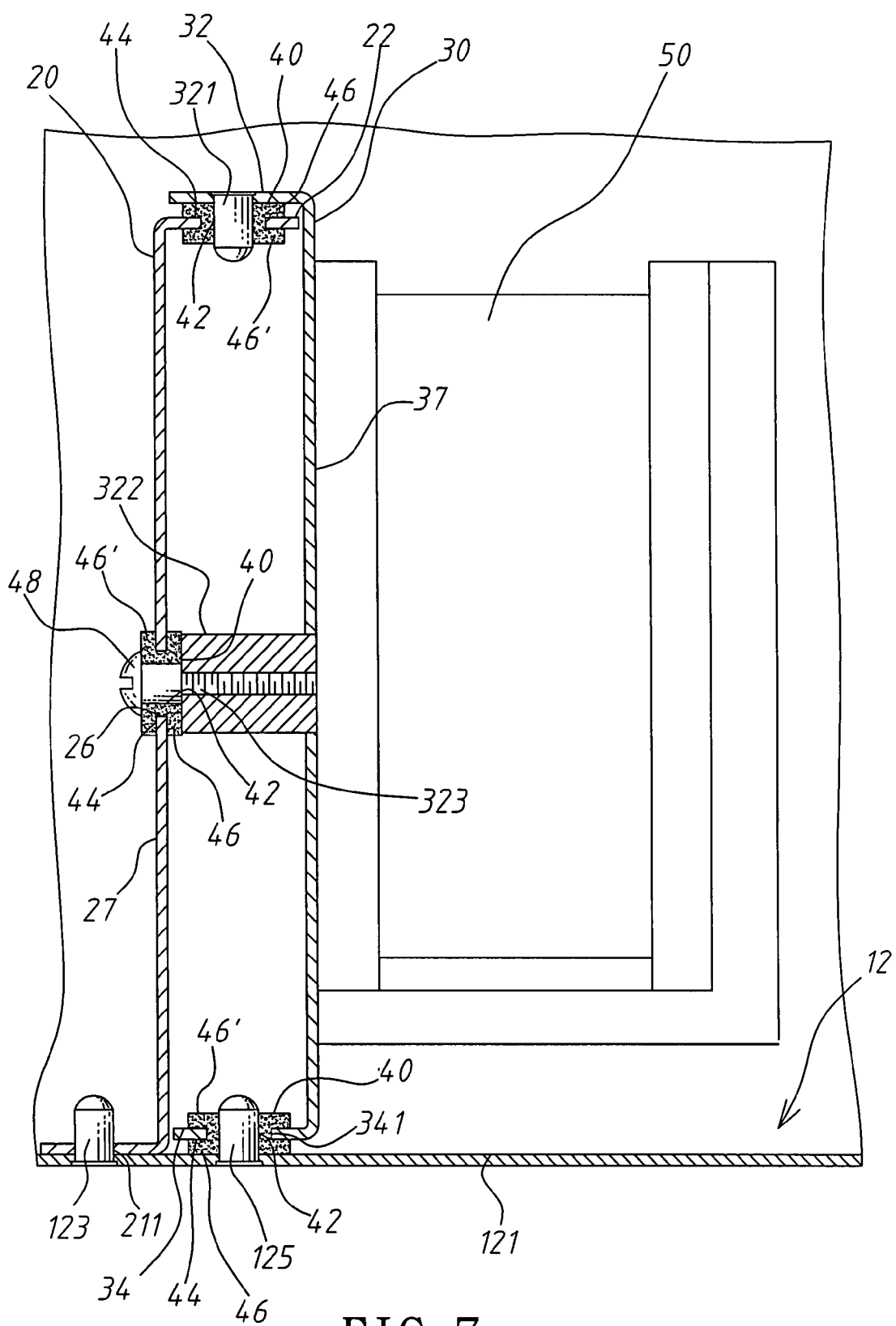
FIG. 7 shows a cross-sectional schematic view of the inner and outer fixing frame of the present invention.

Upper and lower portions of each of the recessed circular grooves 44 of the shock absorber elements 40 are provided with cylindrical bodies 46, 46' respectively, wherein the cylindrical bodies 46 lie between the upper surface 32 of the outer fixing frame 30 and the upper surface 22 of the inner fixing frame 20 (see FIG. 7). Accordingly, the vibratory moment on the outer fixing frame 30 produced by rotation of the fans 50 is absorbed by the shock absorber elements 40.

Figure 2:
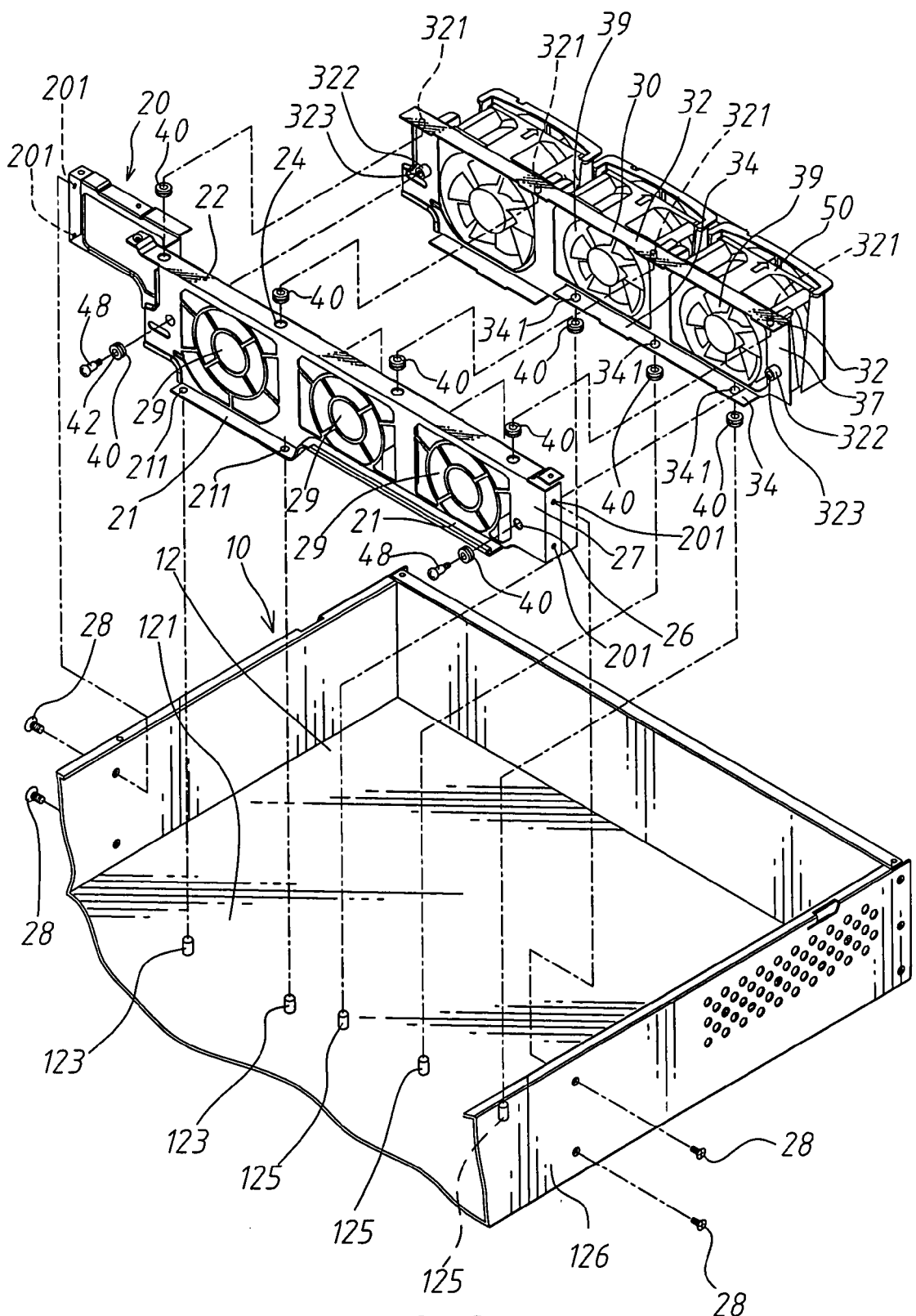
FIG. 2 shows an exploded elevational view of component members of the present invention.
Figure 5:
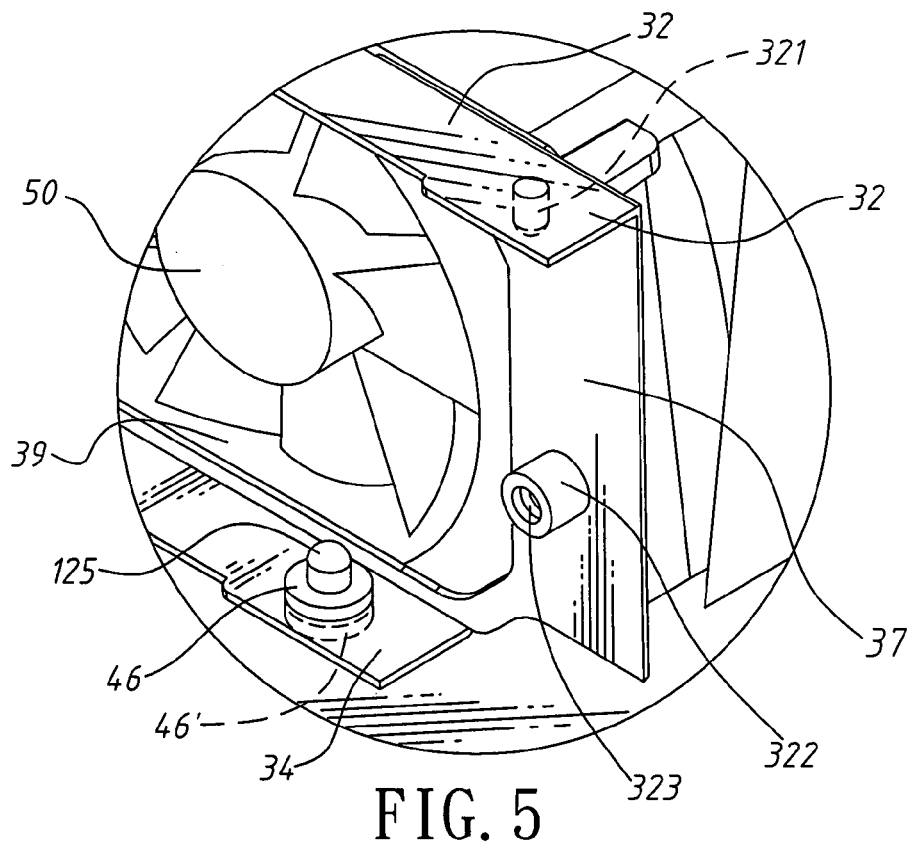
FIG. 5 shows a partial enlarged elevational view of the outer fixing frame of the present invention.

Referring to FIGS. 2, 5 and 7, connecting posts 125 protrude from a housing bottom surface 121 of the U-shaped holding space 12.

At least more than one lower connecting hole 341 is defined in a horizontal lower surface 34 of the outer fixing frame 30.

Referring to FIG. 7, the recessed circular grooves 44 of the shock absorber elements 40 are respectively mounted on the circumferential edges of the lower connecting holes 341, and the connecting posts 125 respectively penetrate the through holes 42 of the shock absorber elements 40. The cylindrical bodies 46 of the shock absorber elements 40 lie between the lower surface 34 of the outer fixing frame 30 and the housing bottom surface 121 of the U-shaped holding space 12. The vibratory moment on the outer fixing frame 30 produced by rotation of the fans 50 is absorbed by the shock absorber elements 40.

Referring to FIG. 8, the shock absorber elements 40 are made from rubber material, and provided with flexibility and shock absorbing characteristics.

Referring to FIG. 2, connecting holes 201 are respectively defined in left and right sides of the inner fixing frame 20, and fixing elements 28 are screwed into left and right side housing wall surfaces 126, (126) of the U-shaped holding space 12 and the connecting holes 201, thereby fixing the inner fixing frame 20 within the U-shaped holding space 12.

Referring to FIGS. 2 and 7, protruding connecting tubes 322 are configured on vertical plates 37 of the outer fixing frame 30, and a screw hole 323 is defined in a tube opening of each of the connecting tubes 322.

Connecting holes 26 are defined in vertical plates 27 of the inner fixing frame 20.

The recessed circular grooves 44 of the shock absorber elements 40 are mounted in the connecting holes 26, bolts 48 respectively penetrate the through holes 42 of the shock absorber elements 40 (see FIGS. 3 and 4) and further screw into the screw holes 323 of the connecting tubes 322, thereby enabling the cylindrical bodies 46 of the shock absorber elements 40 to lie between the edges of the screw holes 323 and the vertical plates 27 (see FIG. 7).

Figure 3:
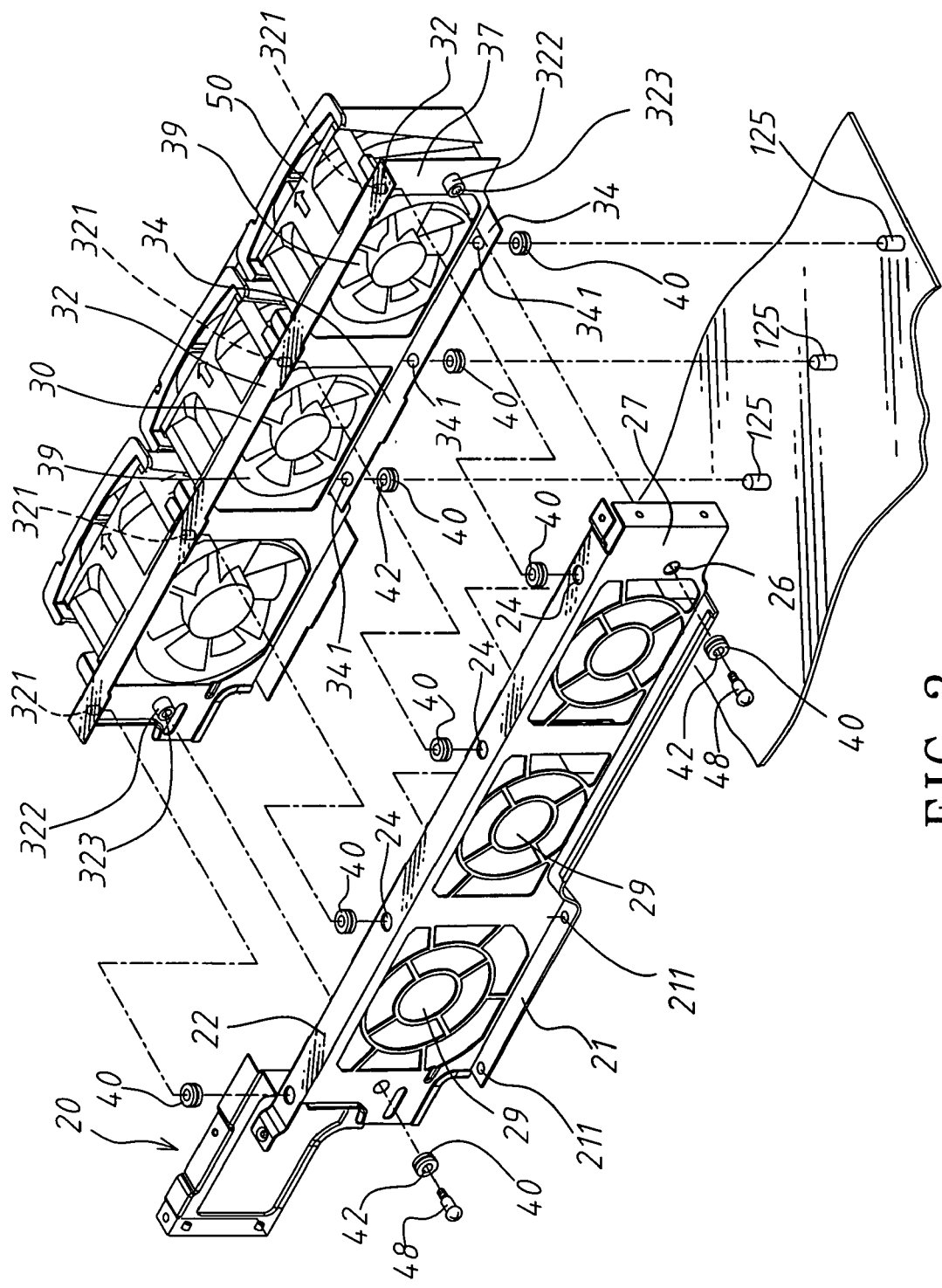
FIG. 3 shows an exploded elevational view of an inner and an outer fixing frame of the present invention.
Figure 4:
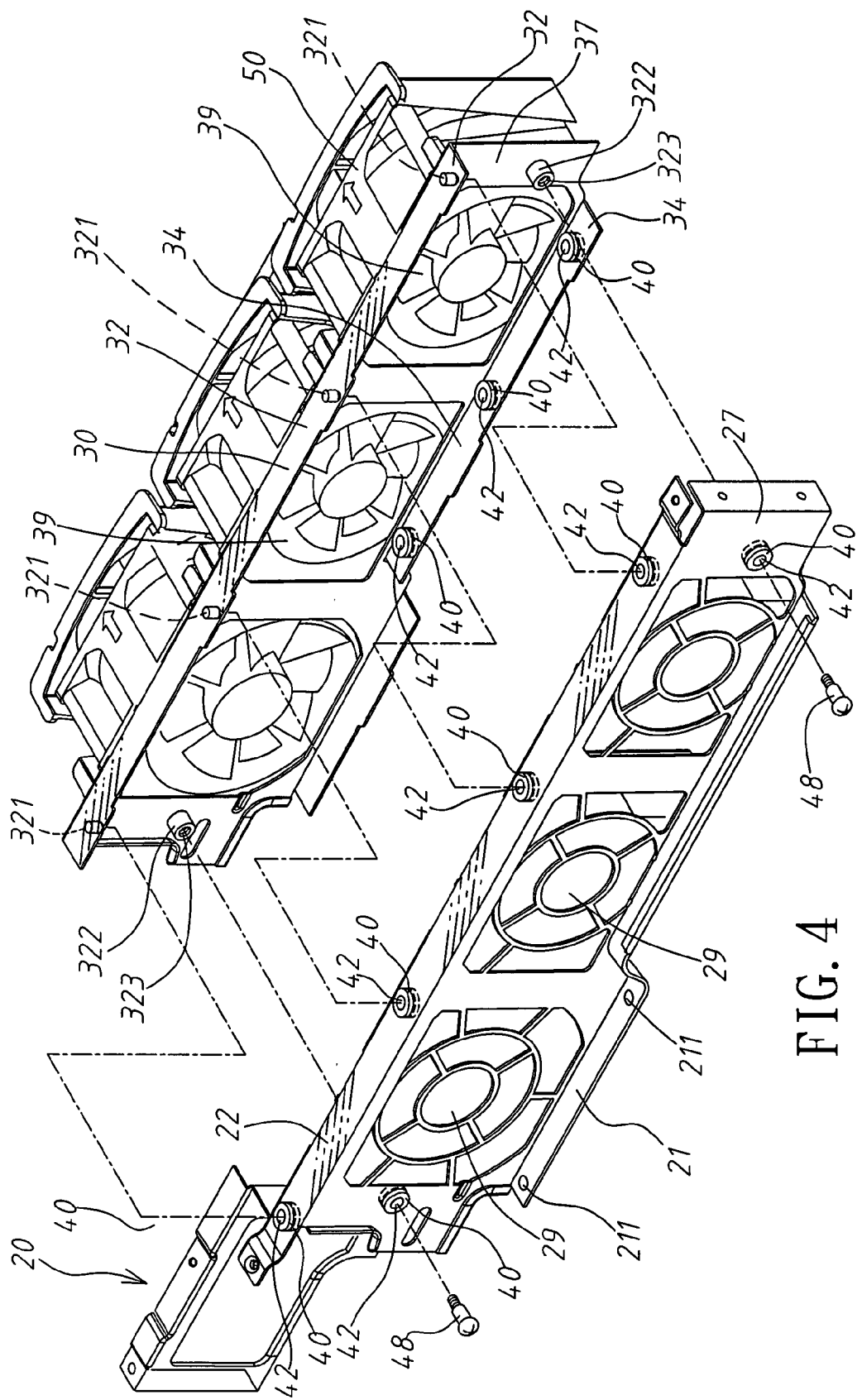
FIG. 4 shows another exploded elevational view of the inner and outer fixing frame of the present invention.

Referring to FIGS. 2, 3 and 4, a plurality of air vents 39, 29 are defined in mutually adjacent sides of the vertical plates 37 of the outer fixing frame 30 and the vertical plates 27 of the inner fixing frame 20 respectively. The two sets of air vents 39, 29 mutually correspond, and the heat dissipating fans 50 correspond to the two sets of air vents 39, 29.

Referring to FIGS. 1, 2, 3 and 4, connecting holes 211 are defined in a horizontal lower surface 21 of the inner fixing frame 20. Rivets 123 protrude from the housing bottom surface 121 of the U-shaped holding space 12 and are fixedly riveted into the connecting holes 211.

Referring to FIGS. 1, 5, 6 and 7, torsional moment produced when fans 50 rotate causes an outer fixing frame 30 to vibrate, whereupon the vibratory moment respectively passes through a plurality of shock absorber elements 40 made from rubber material and provided with shock absorbing functionality. Because of the shock absorption effectiveness of the shock absorber elements 40, thus, the large vibratory force on the outer fixing frame 30 produced by rotation of the fans 50 is not transmitted to an inner fixing frame 20. Accordingly, vibration of the inner fixing frame 20 does not occur, and the vibratory moment of the vibratory source is not transmitted to a U-shaped holding space 12 and a computer housing 10.

Furthermore, because connecting posts 125 protruding from a housing bottom surface 121 of the U-shaped holding space 12 penetrate through and connect with the plurality of shock absorber elements 40, and recessed circular grooves 44 of the shock absorber elements 40 are respectively mounted on the circumferential edges of lower connecting holes 341, thus the vibratory force transmitted downward by the outer fixing frame 30 is absorbed by the shock absorber elements 40, and the vibratory moment is not transmitted to the housing bottom surface 121.

Figure 6:
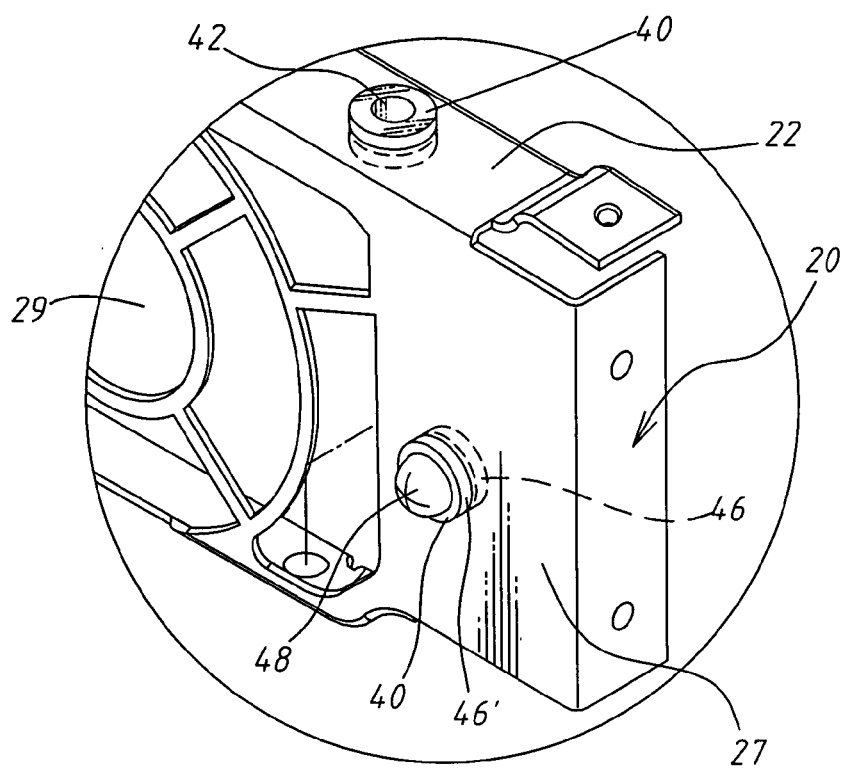
FIG. 6 shows a partial enlarged elevational view of the inner fixing frame of the present invention.

Referring to FIGS. 3 and 6, bolts 48 respectively penetrate the through holes 42 of the shock absorber elements 40, and are further bolted into screw holes 323. Accordingly, vibration produced by the outer fixing frame 30 is absorbed by the shock absorber elements 40, thereby preventing the outer fixing frame 30 from transmitting the vibratory force to the inner fixing frame 20.

In conclusion, the shock absorber elements 40 of the present invention respectively located between the inner and outer fixing frames 20, 30 and the housing bottom surface 121 provide effectiveness to substantially absorb vibration, and is able to effectively minimize noise and prevent the risk of internal components of the computer housing 10 from coming loose.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A computer housing shock absorber device for a vibration source frame, comprising:
    a computer housing provided with a U-shaped holding space;
    an inner fixing frame transversally fixed within the U-shaped holding space, and at least more than one connecting hole is defined in a horizontal upper surface of the inner fixing frame;
    an outer fixing frame, on outer sides of which are fixedly clamped at least more than one heat dissipating fan, a top portion of the outer fixing frame is configured with a horizontal upper surface, and connecting posts are evenly disposed on a bottom surface of the horizontal upper surface;
    at least more than one shock absorber element formed as cylindrical bodies, in the center of each of which is defined a through hole, and a recessed circular groove is defined in the circumference of each of the shock absorber elements; the recessed circular grooves are respectively mounted on circumferential edge walls of the connecting holes of the inner fixing frame, and the connecting posts respectively penetrate the through holes; upper and lower portions of each of the recessed circular grooves of the shock absorber elements are respectively provided with a cylindrical body, and one of the cylindrical bodies of each of the shock absorber elements lies between the upper surface of the outer fixing frame and the upper surface of the inner fixing frame, whereby the vibratory moment on the outer fixing frame produced by rotation of the fans is absorbed by the shock absorber elements.

2. The computer housing shock absorber device for a vibration source frame according to claim 1, wherein connecting posts protrude from a housing bottom surface of the U-shaped holding space;
    at least more than one lower connecting hole is defined in a horizontal lower surface of the outer fixing frame;
    the recessed circular grooves of the shock absorber elements are respectively mounted on the circumferential edges of the lower connecting holes, and the connecting posts respectively penetrate the through holes of the shock absorber elements; one of the cylindrical bodies of each of the shock absorber elements lies between the lower surface of the outer fixing frame and the housing bottom surface of the U-shaped holding space, whereby the vibratory moment on the outer fixing frame produced by rotation of the fans is absorbed by the shock absorber elements.

3. The computer housing shock absorber device for a vibration source frame according to claim 1, wherein the shock absorber elements are made from rubber material, and provided with flexibility and shock absorbing characteristics.

4. The computer housing shock absorber device for a vibration source frame according to claim 1, wherein connecting holes are respectively defined in left and right sides of the inner fixing frame, and fixing elements are screwed into left and right side housing wall surfaces of the U-shaped holding space and the connecting holes, thereby fixing the inner fixing frame within the U-shaped holding space.

5. The computer housing shock absorber device for a vibration source frame according to claim 1, wherein protruding connecting tubes are configured on vertical plates of the outer fixing frame, and a screw hole is defined in a tube opening of each of the connecting tubes; connecting holes are defined in vertical plates of the inner fixing frame; the recessed circular grooves of the shock absorber elements are mounted in the connecting holes; bolts respectively penetrate the through holes of the shock absorber elements and further screw into the screw holes of the connecting tubes, thereby enabling the cylindrical bodies of the shock absorber elements to lie between the edges of the screw holes and the vertical plates.

6. The computer housing shock absorber device for a vibration source frame according to claim 1, wherein a plurality of air vents are defined in mutually adjacent sides of the vertical plates of the outer fixing frame and the vertical plates of the inner fixing frame respectively; the two sets of air vents mutually correspond, and the heat dissipating fans correspond to the two sets of air vents.

7. The computer housing shock absorber device for a vibration source frame according to claim 1, wherein
- connecting holes are defined in a horizontal lower surface of the inner fixing frame;
- rivets protrude from the housing bottom surface of the U-shaped holding space and are fixedly riveted into the connecting holes.

* * * * *